United States Patent [19]

Parker

[11] Patent Number: 4,702,564

[45] Date of Patent: * Oct. 27, 1987

[54] BATTERY TESTER INCLUDING FLEXIBLE SUBSTRATE AND POLYACETILYNIC MATERIAL

[76] Inventor: Robert Parker, 411 Rolling La., Alamo, Calif. 94507

[*] Notice: The portion of the term of this patent subsequent to Oct. 27, 2004 has been disclaimed.

[21] Appl. No.: 847,947

[22] Filed: Apr. 3, 1986

Related U.S. Application Data

[63] Continuation-in-part of Ser. No. 723,329, Apr. 15, 1985.

[51] Int. Cl.$^4$ .................... G02F 1/133; G01R 19/165
[52] U.S. Cl. .................................... 350/351; 324/104
[58] Field of Search .................. 350/331 R, 341, 346, 350/336, 351, 320; 324/96, 104, 106, 435, 437; 428/1; 340/815.1

[56] References Cited

U.S. PATENT DOCUMENTS

| | | | |
|---|---|---|---|
| 2,522,660 | 9/1950 | Bledsoe | 324/437 |
| 3,454,873 | 7/1969 | Abrahams | 324/437 |
| 3,600,060 | 8/1971 | Churchill et al. | 350/336 |
| 3,700,306 | 10/1972 | Cartmell et al. | 350/341 |
| 3,781,080 | 12/1973 | Aftergut | 350/336 |
| 3,925,977 | 12/1975 | Maezawa | 350/336 |
| 4,006,414 | 2/1977 | Parker | 350/351 |
| 4,264,149 | 4/1981 | Zwart | 350/346 |
| 4,360,780 | 11/1982 | Skutch | 324/437 |
| 4,380,371 | 4/1983 | Frantz | 350/336 |
| 4,457,589 | 7/1984 | Tamura | 350/336 |

FOREIGN PATENT DOCUMENTS

| | | | |
|---|---|---|---|
| 0126559 | 10/1979 | Japan | 350/334 |
| 2119110 | 11/1983 | United Kingdom | 350/334 |

OTHER PUBLICATIONS

Wargin et al., "A Large, Flexible, Liquid Crystal Display Cell" IEEE Conference Record Conference on Display Devices 1972, N.Y. U.S.A., Oct. 11-12 1972.

*Primary Examiner*—Stanley D. Miller
*Assistant Examiner*—David Lewis
*Attorney, Agent, or Firm*—Shyamala T. Rajender

[57] ABSTRACT

A device for testing a battery, particularly a small, portable battery, comprising a flexible, transparent substrate on which is deposited a narrow band of a black light absorbing material. A conductive material, which may taper outwardly in opposite directions from a central point to a pair of outer terminals, is then deposited atop the substrate on the same side of the substrate as the absorber layer or on the opposite side of the substrate as the absorber layer. A layer of a cholesteric liquid crystal material is then deposited on the substrate on the opposite side from the black absorber layer or over the absorber layer. The conductive material is an epoxy cement-based conductor, preferably silver, printed or painted directly on to the substrate. An indicator scale is located along sections of the conductive material. To test a dry cell battery, the terminal ends of the conductive material are placed in contact with the battery terminals, causing a current to flow which heats the conductive material, the heat generated being the most intense at the central point and radiating outwardly. The heat is transferred through the thin substrate to the liquid crystal layer which results in a color change in the liquid crystal. The traverse of the color change along the length of the indicator scale, outwardly from the center point, is proportional to the current or voltage output or the condition of the battery to be tested and can be read on the indicator scale which is calibrated accordingly. The tester also includes means for determining the amp-hours or life of a battery.

18 Claims, 8 Drawing Figures

BATTERY TESTER INCLUDING FLEXIBLE SUBSTRATE AND POLYACETILYNIC MATERIAL

RELATED APPLICATIONS

This is a continuation-in-part application of U.S. application Ser. No. 723,329, filed Apr. 15, 1985.

BACKGROUND OF THE INVENTION

This invention relates to battery testers, particularly to an improved tester for small, portable batteries, and more particularly to simply constructed, inexpensive tester with no moving parts, whereby a small battery can be readily tested.

The extent of the use of small batteries, particularly dry cell batteries, has increased rapidly and steadily during the last decade, and a substantial effort has been directed to the production of recharging devices for such batteries, as well as providing means for testing the strength or condition of the batteries. Batteries are often stored prior to use and in many instances are discarded for new ones without determining the existing strength or condition of the batteries, thereby resulting in a substantial waste of useful battery life.

A few battery testers and indicating devices are known in the prior art but they are bulky, cumbersome or expensive, use complex electric or electronic components and circuitry and are designed mostly for large lead-acid type batteries used in the powering of transmitters, receivers, servos and the like.

Some of these indicating devices or their components are exemplified in the following patents:

U.S. Pat. No. 4,006,414 issued Feb. 1, 1977 to Robert Parker; U.S. Pat. No. 3,974,441 issued Aug. 10, 1976 to Johannes Van Den Haak; U.S. Pat. No. 4,022,706 issued May 10, 1977 to Frederick Davis; U.S. Pat. No. 4,290,021 issued Sept. 15, 1981 to Jacob J. Thereon; U.S. Pat. No. 4,066,897 issued Jan. 3, 1978 to Ralph L. Belcher; U.S. Pat. No. 3,600,060 issued Aug. 17, 1971 to Donald Churchill; and U.S. Pat. No. 4,360,780 issued Nov. 23, 1982 to William G. Skutch, Jr.

The foregoing status of the art indicates that a need has existed in this field for an inexpensive and simple device or means for readily testing the charge state or condition of batteries, such as those of the 1.5 and 9 volt dry cell types. The battery tester described and claimed in the related application Ser. No. 723,329, has partially fulfilled this need. with such a tester one could readily test batteries especially dry cell batteries before deciding to discard them and install new ones at the time of contemplated use. However, a need still exists for an even more simply constructed dry cell battery tester as well as a means to indicate the ampere-hours or the number of hours or amperage discharged or useful battery life remaining or for warranty purposes on electrical appliances and equipment.

SUMMARY OF THE INVENTION

The present invention fills the above mentioned need by providing an effective device for readily testing batteries such as the 1.5 and 9 volt dry cell type and which, at the same time, lends itself to simple and inexpensive means and methods of fabrication, as well as to provide for the determination of the amp-hours used up or the remainder of useful battery life.

Therefore, it is an object of the present invention to provide an improved means for testing batteries, particularly, dry cell batteries.

A further object of the invention is to provide a battery tester which can be readily used by purchasers of small, portable batteries and which has multiple voltage taps for testing batteries of different sizes and different voltages.

Another object of the invention is to provide a battery tester which basically consists of a conductive material deposited in a specific pattern on a layer of a cholesteric crystal material carried on a substrate, such that current flowing through the conductive material produces a temperature gradient, which in turn causes a color change or a line of delineation in the cholesteric liquid crystal material, the distance traversed by the color change or the length of the line being proportional to the strength of the battery.

Another object of the invention is to provide a method for fabricating a battery tester which includes depositing a cholesteric liquid crystal material and a conductive material on a flexible substrate in selected patterns, such that contact of the battery terminals by opposite end portions of the conductive material results in a color change in the liquid crystal material which is an indication of the strength of the battery.

Another object of the invention is to provide a method for making a plural pattern battery tester which utilizes a single layer of liquid crystal material.

Another object is to provide a battery tester, such as the type described and claimed in the above-referenced application Ser. No. 723,329, which includes means for determining the amp-hrs of use left in the battery.

Additional objects, advantages and novel features of the invention, together with additional features contributing thereto and advantages accruing therefrom will be apparent from the following description and the accompanying illustrations of various embodiments of the invention and the description of the fabrication technique therefor, as described hereinafter. The objects and advantages of the invention may be realized and attained by means of the instrumentalities and combinations particularly pointed out in the appended claims.

In accordance with the foregoing objects of the invention, the battery tester of this invention is similar to that in the application Ser. No. 723,329, identified above, and basically consists of a flexible, preferably transparent substrate or film on which is deposited a layer of a dark, light absorbing material, and, on top of the absorber, a layer of a conductive material, such as silver, nickel or carbon in a binder base such as epoxy or urethane, in at least a single wedge or a double wedge (bow-tie) configured pattern, and which terminates in or has connected to the pattern, at least one pair of opposite ends or terminals for contacting the terminals of a battery, such as a dry cell battery, to be tested. A microencapsulated cholesteric liquid crystal layer is deposited on the other side of the substrate.

By way of example, a thin film of a black, light absorbing or "backing" material is deposited on a thin, flexible, transparent substrate. The black backing material or absorber may be derived from any dark paint such as a black latex or uv curing paint. A conductive material comprising epoxy or urethane based silver, nickel or carbon granules or powder is deposited on the transparent substrate or film on top of the absorber layer, so as to form at least a single wedge or a "bow-tie" shaped pattern having terminal end portions. A layer of a microencapsulated cholesteric liquid crystal material is then deposited on the other side of the substrate. When the terminal end portions of the conductive material are contacted with the terminals of a battery, a current through the conductive material, generating heat in the conductor. The heat is then transferred through the substrate to the liquid crystal material causing a change in its color. The color change in the liquid crystal material is rendered more readily visible or discernible by the black, light absorbing, backing material. To protect the conductive pattern, a suitable protective coating may be deposited on all areas of at least the conductive pattern except the terminals or contact points. The protective material may be any uv curing paint. One embodiment of the invention uses one bow-tie shaped pattern, with two sets of conductive patterns connected thereto, whereby either 1.5 or 9 volt batteries may be conveniently tested using the same tester. The tester may be used, for example, for testing a 9 volt battery, or a conventional 1.5 volt battery such as the cylindrical AAA, AA, C and D types of batteries. But in addition, the tester may be provided with a layer of polyacetylene on one or a portion of one of the wedge shaped patterns, which turns optically dark as function of time and temperature to indicate amp-hrs, either used up or remaining in the battery, whereby the battery life may be readily determined. A suitably calibrated scale may be appended to the substrate to indicate the amp-hrs consumed.

Another embodiment of the subject invention utilizes multiple voltage taps for use with batteries of different voltages and sizes.

When a current passes through the conductive material pattern, a temperature gradient is generated beginning at the center point of the double-wedge or "bow-tie" and radiates towards the terminal ends. The heat generated is transferred through the substrate to the liquid crystal material layer which changes color starting at a point corresponding to the central point of the bow-tie configuration of the conductor, moving farther towards the rounded edges of the bow-tie pattern. The farther the outward displacement of the color change, the greater is the voltage output or the strength of the battery being tested. A calibrated scale, indicating a relationship between voltage or current vs. distance traveled, may be located along the bow-tie pattern such that color changes in the liquid crystal material corresponding to only the central section of the conductive material indicates a weak battery while color changes in the liquid crystal material corresponding to a length beyond the central section and beyond or through the entire length of the pattern indicates a good to a strong battery condition. As the liquid crystal layer is heated by current flow therethrough, the polyacetylene material turns optically dark in proportion to the amp-hours in the battery being used up.

DETAILED DESCRIPTION OF THE INVENTION

Figure 1:
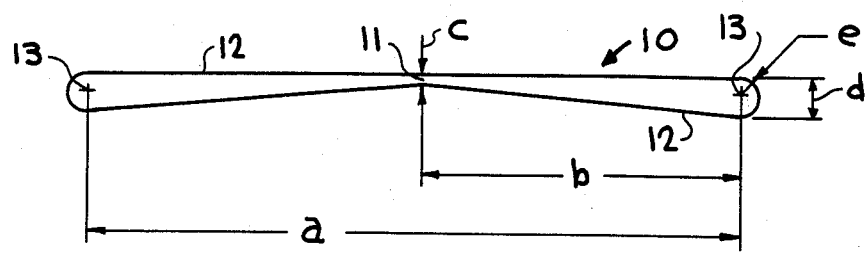
FIG. 1 illustrates a bow-tie configured member of conductive material, with dimensions of the various sections thereof illustrated.

The present invention involves an improved device for testing batteries, particularly dry cell batteries, and a method for fabricating one embodiment of the device. One embodiment incorporates means for determining the life of a battery. For example, one embodiment can be readily used to test batteries of the 9 volt type used in small portable calculators, flashlights, portable stereos, travel clocks, portable radios and the like, which have two adjacent terminals or contacts points on opposite ends of the battery. One embodiment incorporates a voltage tap for use with batteries of different voltages. Basically, the battery tester of this invention is constructed in a manner similar to that used in the construction of the tester described in the above-referenced application Ser. No. 723,329, and involves depositing a pattern of electrically and thermally conductive material on a substrate, the pattern being in the form or configuration of a single-wedge or double-wedge or "bow-tie" (tapering from a small central point outwardly in opposite directions) but with each outer end terminating in or connected to two sets of contact points which make contact with the terminals of a battery to be tested. The conductive material may be epoxy based silver, nickel or carbon. The tester additionally includes an absorber or backing band or strip deposited on the substrate, preferably on the same side of the substrate as the conductive pattern. A layer of a microencapsulated cholesteric liquid crystal material is deposited on the opposite side of the substrate from the absorber layer. As used herein, the terms "cholesteric liquid crystal", "liquid crystal" and "liquid crystal material" are used interchangeably throughout this description and refer to the same liquid crystal materials disclosed and claimed herein. An indicator scale can also be located along the length of the "bow-tie" shaped pattern, since the liquid crystal material changes color in a direction corresponding to the length of the conductive pattern, starting at a point corresponding to the central point of the pattern. The greater the displacement of the color change from the central point, the greater is the current flow, which is proportional to the strength or condition of the battery. The dark or black backing material or backer makes the color change easily observable and may be derived from any dark paint such as a black latex or uv curing paint. Other paints or coating materials are also suitable. A suitable protective coating may be optionally applied over the "bow-tie" and conductive pattern except at the terminal ends thereof, to protect it from wear and tear, and to ensure correct placement of the tester contacts on the battery terminals.

Cholesteric liquid crystals are chosen as the indicating materials because of the brilliant iridescent colors they exhibit when exposed to changes in temperature, pressure and electric fields. Cholesteric liquid crystal materials suitable for use in the subject invention include but are not limited to cholesteryl chloride, cholesteryl oleyl carbonate, cholesteryl bromide, cholesteryl acetate, cholesteryl nanoate, cholesteryl oleate, cholesteryl caprylate, and the like. In addition, all the cholesteric liquid crystals disclosed and listed in U.S. Pat. Nos. 4,022,706 and 3,600,060 are incorporated herein by reference and made a part hereof, as being suitable for use in the subject invention.

A determination of the amp-hours or the number of hours and amps discharged (or remaining battery life) for warranty purposes on electrical appliances and the like, can be accomplished by accomplished by the use of polyacetylene material deposited on top of a portion of the conductive patterns. This can be accomplished with a removable recording label with pressure-sensitive backing, so that a permanent record is made. The polyacetylenic material responds optically turning dark with time and temperature. By placing an appropriately calibrated current-time indicator comprising a quantity of polyacetylene on one half of one of the wedge-shaped sections of the liquid crystal material of the tester, both the current condition of the battery and the amp-hours or battery life remaining (or consumed) can be readily determined. By a measurement of the optical change in the acetylenic material at ambient temperature as compared to the optical change in the indicator during operation under testing conditions, background change or "noise" can be biased. A measurement of the amp-hours or the useful life of a battery or appliance remaining, can be useful in establishing or defending claims of warranties on electrical appliances, automotive batteries and the like. It can also be used to periodically inspect equipment after 1 hours' use(?) By the use of a current-time indicator employing polyacetylenic materials, changes in ambient temperature may also be measured and compensated for changes in time and temperature.

Referring now to the drawings, FIG. 1 illustrates an embodiment of a bow-tie configured pattern 10 of conductive material composed of a layer of granular metallic silver in an epoxy based coating material. The bow-tie pattern consists of a small cross-sectional or central sectional point 11 and a pair of outwardly tapering arm sections 12 which terminate in curved ends 13 which, in turn, form an electrical contact with the terminals of a dry cell battery as described hereinafter. By way of example, the length 'a' of pattern 10 is about four (4) inches, the length 'b' being about two (2) inches and width 'c' being about 0.037 inch, the distance 'd' being about 0.225 inch, and the radius 'e' being about 0.112 inch. The configuration or pattern 10 is designed for testing a battery having terminals on opposite ends thereof, as described below.

Figure 2:
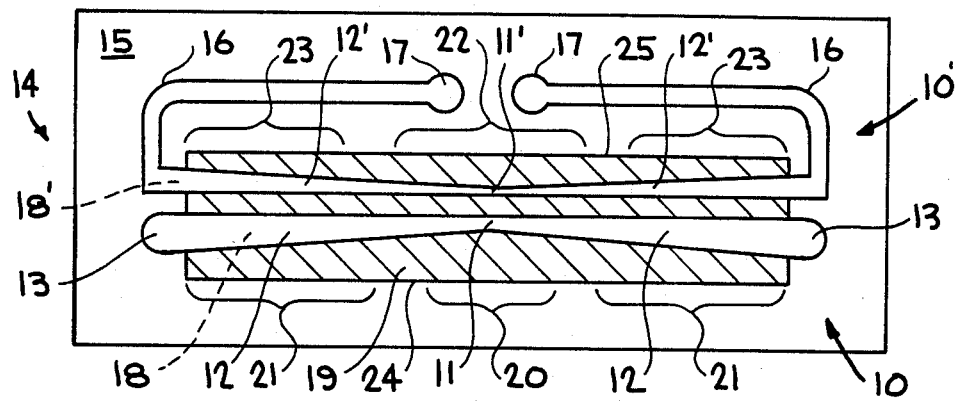
FIG. 2 illustrates an embodiment of the battery tester of the above-referenced application Ser. No. 723,329.
Figure 3:
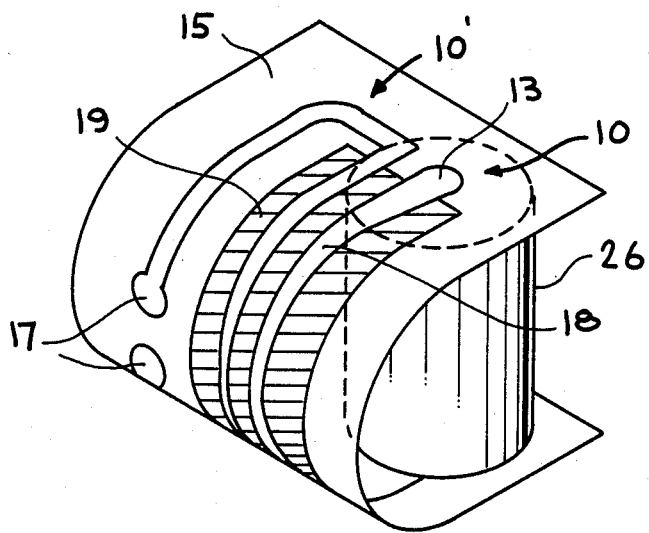
FIG. 3 illustrates the battery tester of FIG. 2 positioned to test a battery having adjacent terminals such as a 1.5 volt battery.

FIGS. 2 and 3 illustrate an embodiment of the battery tester described and claimed in copending application Ser. No. 723,329, and generally indicated at 14, which utilizes two separate conductive material patterns 10 and 10' which are deposited on a transparent substrate or film 15 composed, for example, of transparent, high temperature stable, film or support of polyester (such as Dupont's mylar), polycarbonate, polyamide, polysufone, paper, preferably, fiber or nylon enforced, cellulose, laminates and the like. Other high-temperature stable polymers are equally suitable.

The film 15 is preferably transparent so that the user can easily match the terminal ends or contacts 13 of the conductive pattern 10 with the terminals of the battery being tested as shown in FIG. 3. The film, for example, may vary in thickness from about 0.001 inch, with a preferred thickness of about 0.002 to 0.005 inch. Film of a thickness less than about 0.001 inch would be too insubstantial to be operative satisfactorily, for testing the condition of batteries, while a film thicker than about 0.010 inch would result in longer response times (because the time required for the battery tester to reach thermal equilibrium would then be greater than 5–10 seconds) and consequent loss of the observed color change.

The conductive material forming patterns 10 and 10' is deposited on the film or substrate 15 by printing, coating, painting or other conventional depositing techniques. This conductive material may be epoxy based silver, nickel or carbon and may be in the form of a conductive "ink". Silver is the most preferred conductor. Epoxy or urethane based silver, nickel or carbon and the like are the materials of choice. The conductive material, preferably, should have a resistance of about 0.1 to 0.020 ohms per square. The dimensions of the preferred "bow-tie" 10 of FIG. 2, for instance, are designed to give a pattern that will have a resistance of about 2–2.5 ohms. This is the optimum value given by the manufacturer (such as Union Carbide) of the cylindrical dry cell batteries in their manuals relating to their 1.5 volt AAA, AA, C and D size batteries. The "bow-tie" pattern 10' of FIG. 2 is designed to have a resistance of about 100 ohms, to test a 9 volt battery. The tester tests the battery under a resistive load similar to that in its normal operational uses. It was found that the tester operated best over a range of 1–5 ohms with a preferred resistance of about 2.25 ohms for 1.5 v batteries. In the embodiment illustrated in FIG. 2, the ratio of the dimensions from the narrowest to the widest taper of the silver conductive material is about 6 to 1 for the "bow-tie" pattern.

Referring again to FIG. 2, the conductive pattern 10' is designed for testing a 9 volt transistor type battery (those having adjacent terminals or contacts) and includes a center point or section 11', a pair of outwardly tapering arm sections 12', a pair of circuit paths or sections 16, connected to the outer ends of arms 12', which terminate in contacts or terminal ends 17 spaced so as to coincide with the distance separating the adjacent terminals on a conventional 9 volt transistor type battery (usually 50–150).

Layers 18 and 18' of a cholesteric liquid crystal material are deposited on the side of substrate 15 opposite to that on which the conductive layer or patterns 10 and 10' are deposited and in alignment with the conductive patterns. A layer or band 19 of a black light absorber or backing material or backer, such as a black latex paint, or black uv curing paint is deposited on substrate 15 on the same side as the conductive patterns 10 and 10'. The absorber or backing layer or band 19 does not extend the full length of arms 12 and 12' of the "bow-tie" pattern 10 and 10' so that the contact or terminal ends 13 extend beyond the absorber layer 19, thereby enabling the user of the tester to observe and match the contacts or terminals of the tester with the terminals of the battery being checked as illustrated in FIG. 3. Similarly, the width of the absorber or backer layer 19 does not extend to the circuit paths 16 or the terminal ends 17 of conductive pattern 10′ which enables the user to observe and match the contact between terminal ends 17 and the terminals of the battery being tested. Alternatively, the absorber or backer layer 19 can be deposited on the film or substrate 15, whereafter conductive patterns 10 and 10′ are deposited onto absorber layer 19 on the substrate adjacent the absorber layer taking care that the terminal ends of the conductive patterns are not covered or superimposed by the absorber layer. The liquid crystal layers 18 and 18′ are then deposited on the opposite or other side of the substrate 15. Since liquid crystals diffracts only about 15% of any incident light, the black light absorbing material facilitates observation and measurement of color changes in the liquid crystal material against a dark background. Although the foregoing sequential order of depositing the various components is illustrated in the embodiment of FIG. 2, this order is not critical or necessary for the operation of the tester. For instance, the conductive layer may be alternatively placed directly atop the absorber layer which is deposited on top of the liquid crystal layer, all on the same side of the substrate.

As shown in FIG. 2, substrate 15 is also provided with a plurality of scale sections or segments located adjacent the edges of absorber or backer layer 19, as indicated at 20 and 21 for conductive pattern 10 and at 22 and 23 for conductive pattern 10′. These scale segments may be deposited directly onto substrate 15. The area of the patterns 10 and 10′ indicated by center scale segments 20 and 22 indicate a weak, "bad" or low battery, while the outer segments 21 and 23 indicate a strong, "good" or charged battery. For example, the center scale segments 20 and 22 may be colored red, with the outer scale segments 21 and 23 being colored green to correspond to the conventional battery test color codes. While not illustrated in the figures, scale segments 20–23 may be marked in voltage increments on an outwardly increasing scale from 0 at the center point 11—11′ to the full voltage on the outer portions of arms 12 and 12′of the patterns 10 and 10′ (i.e., 1.5 or 9.0, for example). While the embodiments of the scale sections illustrated in FIG. 2 include spaces indicated at 24 and 25 between adjacent scale sections (between central section 20 or 22 and each of the outer sections 21 or 23, for example) these spaces 24 and 25 may include a separately colored portion (red and green striped or orange or red and black striped, for example) to indicate that the battery is near weak or "replace soon" condition. Furthermore, the scale sections indicated in the embodiment of FIG. 2 may be replaced with a continuous scale from center points 11 and 11′ to a selected outer point on arms 12 and 12′ and be marked or calibrated from 0 volts at the center point to the full voltage, such as 1.5 or 9.0, at the outer point, and if desired, the scale may be colored gradually progressing from, for example, a bright red at the center point to a bright green at the outer point.

By way of example, the components of the battery tester illustrated in FIG. 2 may have the following dimensions: the transparent flexible substrate 15 has a length of about 5 inches, width of about 2 inches, and thickness of about 0.005 inch. The absorber or backer layer or band 19 has a thickness of about 0.0002 inch, a length of about 4 inches and a width of about 0.60 inch and, if desired, may be reduced to about 0.20 inch. The liquid crystal layers 18 and 18′ have a thickness of about 0.002 inch, preferably about 0.001 inch. The dimensions of the conductive layer or pattern 10 is as described in a preceding section relative to FIG. 1. The conductive layer or pattern 10′ has an overall length of about 4 inches, with a width at point 11′ of about 0.010 inch and a width at the outer end of each arm 12′ of 0.050 inch, with the circuit paths 16 having a width of about 0.075 inch and an overall length of about 2 inches (each circuit path 16 having an L-shaped configuration with the base or foot section having a length of about 0.50 inch and the leg section having a length of about 1.5 inches) with circuit paths 16 terminating in terminal ends 17 having about a ¼ inch outer diameter. The terminal ends 17 are located about ½ inch apart. The thickness of the conductive patterns 10 and 10′ is about 0.0002 inch. The scale segment 20 is about ¾ inch in length, with the segments 21 being about 1¼ inch in length, while the scale segment 22 is about 1½ inches in length, with the segments 23 being about 1 inch in length. The conductive patterns 10 and 10′ are separated by a section of the absorber or backer layer 19, as indicated at 24, which has a width of about 0.10 inch. The purpose of reducing the length of the absorber or backer layer 19 is to allow for a portion of the outer section of the conductive arms 12 to be exposed (i.e., not supported or covered by the black absorber or backer material) for making electrical contact. The conductive patterns 10 and 10′ may be optionally covered by an insulating protective layer. Insulating protective material may be any conventional material used for such purposes, but is preferably a uv curing ink.

While the dimensions indicated above are conveniently used in the embodiment of FIG. 2, other dimensions and shapes may be used for the conductive patterns. The two arms of the bow-tie configuration may be unequal in length and may be unsymmetrical.

An example of the operation of the battery tester such as the embodiment thereof illustrated in FIG. 2 is described below:

For a battery such as a conventional 1.5 volt type (AAA, AA, C and D for example) with terminals located at opposite ends thereof, the flexible substrate 15 is wrapped or curved around the battery such that the terminal ends 13 are placed in physical contact with the terminals of a battery 26, as shown in FIG. 3. The resulting current flow through the conductive pattern 10 places the battery 26 under an ideal resistive load. The heating caused by the current flow results in color change in the liquid crystal material 18 which shows up along arms 12 as described above. The strength or condition of battery 26 is readily determined from the calibrated scale segments 20–21 which correspond to the color change along arms 12 of the conductive material.

The above description of the embodiment illustrated in FIG. 2, which is described and claimed in copending application Ser. No. 723,329, has been set forth in detail to provide a clear understanding of the basic features of the tester and materials utilized in the construction thereof. These basic features and materials are incorporated into various embodiments which illustrate the present invention. The embodiments which illustrate the present invention constitute improvements over and additions to the basic features of the above-referenced copending application.

Figure 4:
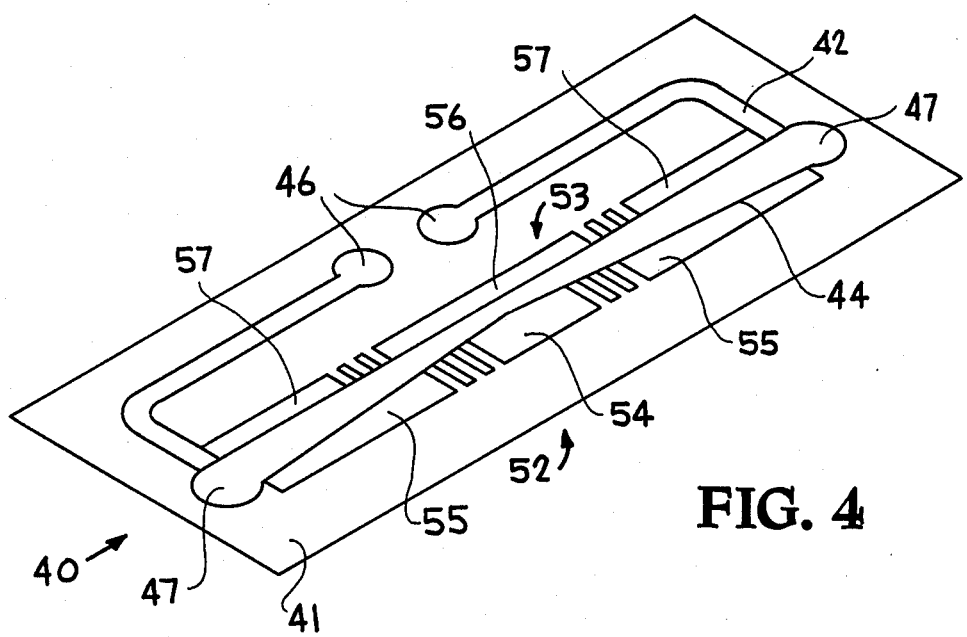
FIG. 4 is an embodiment similar to that of FIG. 2 but utilizes only a single conductive pattern having two sets of terminals and a single layer of liquid crystal material for testing batteries of different voltages.

Referring now to FIG. 4, which illustrates an embodiment of the present invention, the tester shown has conductive patterns for testing 1.5 and 9 volt batteries, similar to that of FIG. 2, but utilizes a pair of "bow-tie" shaped conductive patterns and a single pattern or layer of liquid crystal material. The conductive patterns for the 9 volt and 1.5 volt testing are superimposed on each other with an insulator material therebetween to separate them. This is better illustrated in the exploded view shown in FIG. 5.

Figure 5:
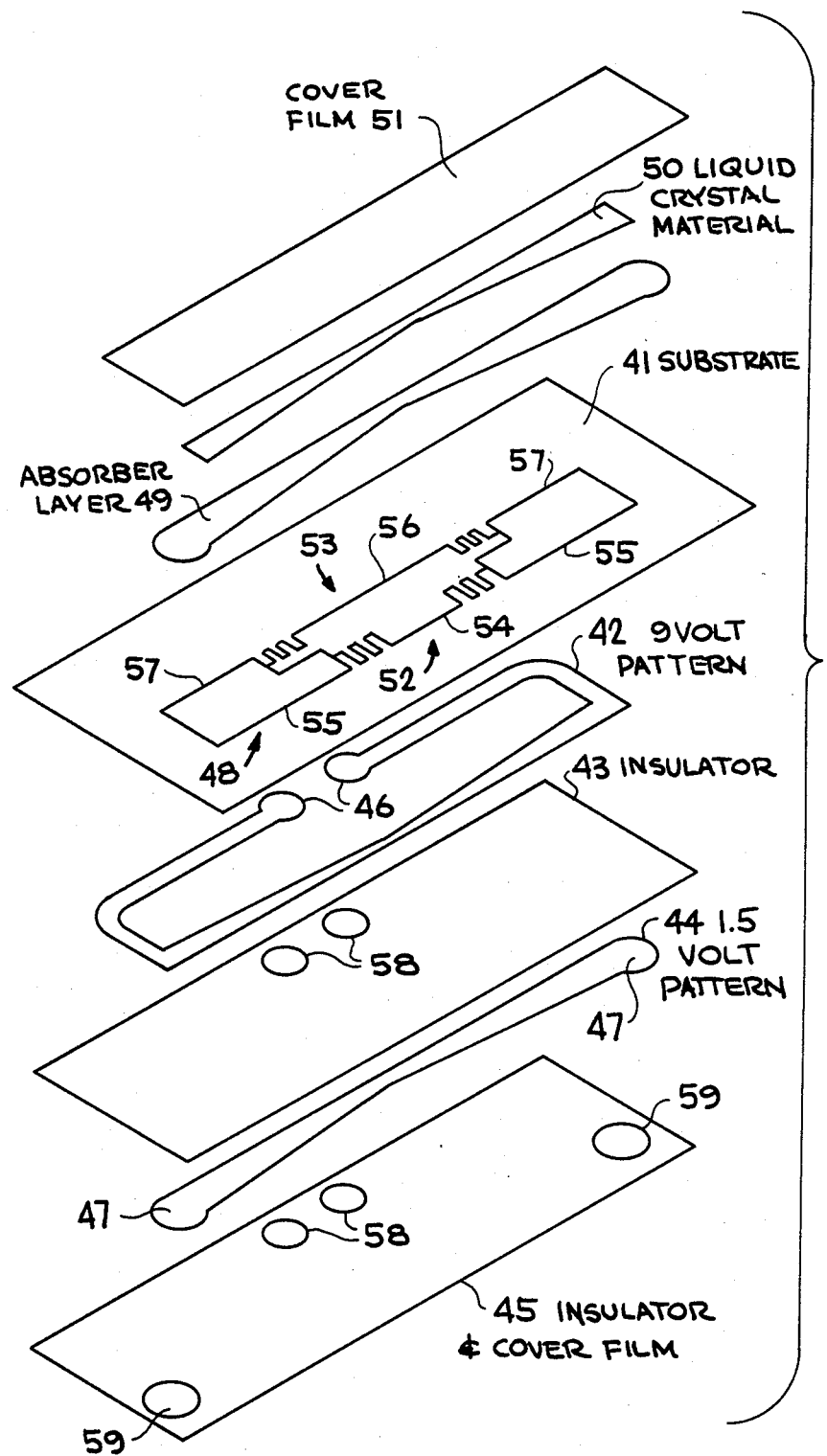
FIG. 5 is an exploded view of the tester of FIG. 4.

The embodiment of the tester shown in FIGS. 4 and 5 is generally indicated at 40 and is constructed such that the conductive patterns are on one side of a substrate and the absorber or backer layer and liquid crystal material are located on the opposite side of the substrate, with the voltage scales located adjacent the liquid crystal material. As more clearly seen in FIG. 5, the tester 40 comprises a flexible, transparent substrate 41 having deposited on one side thereof a conductive pattern 42 for a 9 volt battery, a silk screen printed insulative layer 43, and a conductive pattern 44 for a 1.5 volt battery. The "bow-tie" sections of patterns 42 and 44 are located so as to be coaxial with each other. An insulative layer or cover film 45 is deposited over the conductive patterns 42 and 44 except at their respective contact points 46 and 47. Note that in FIG. 5, holes are shown in layers 43 and 45 which cooperate with contact points 46 and 47 so that the insulation layer does not cover the contact points, thereby providing better electrical contact between the conductive patterns 42 and 44 and the terminals of an associated battery to be tested. A appropriately calibrated scale 48 to represent voltage or battery condition is deposited on or secured to a side of substrate 41, opposite the location of the "bow-tie" section of the conductive pattern 42. An absorber or black backer layer 49 is deposited on the scale 48 so as to be coaxial (in alignment) with the "bow-tie" section of the conductive patterns, and a layer of liquid crystal material 50 is deposited in turn on the backer or absorber layer 49. A protective cover film 51 is deposited over the liquid crystal material 50 and the scale 48. Scale 48 includes a 1.5 volt section, generally indicated at 52 and a 9 volt section generally indicated at 53. By way of an example, the 1.5 volt section may include a central weak, "bad" or low battery indicator segment 54 and two outer strong, "good" or charged battery indicator segments 55. Similarly, the 9 volt scale section 53 may include a central, weak battery indicator segment 56 and the two outer strong battery indicator segments 57. The scale 48 of tester 40 may be designed or configured as discussed in the section describing the embodiment of FIG. 2. Note that insulation layers 43 and 45 have holes 58 which align with contact points 46, while insulating layer 45 is shown with holes 59 which align with contact points 47. A comparison of the two embodiments represented in FIGS. 4 and 2 respectively, will show that the difference between them lies in the elimination of one layer of liquid crystal material and superimposing the conductive patterns on one another, thereby reducing the overall size of the tester and associated savings in cost due to the utilization of less material, while at the same time utilizing the liquid crystal material more effectively.

While various techniques may be used to fabricate the embodiment of the battery tester illustrated in FIGS. 4 and 5, the following is a description of the fabrication process or method utilized to construct the battery tester for experimental purposes for verifying the operability of the invention. The method consists of the following operational steps:

(a) forming a substrate 41 of the desired dimensions from a piece of material such as a polyester, polyamide or polycarbonate which is transparent and flexible;

(b) depositing (printing or coating) a layer or pattern 42 of a conductive material on one side of substrate 41. This may be accomplished using a template cut out to correspond to the desired shape and dimensions of the conductive pattern 42;

(c) depositing a layer of electrically insulating material 43 over the conductive pattern 42 except at contact points 46. This may be accomplished by silk screening or printing using various u.v. dielectric inks.

(d) depositing (printing or coating) a conductive layer or pattern 44 of the same or different conductive material as in step b above, on substrate 41 and over insulation layer 43 such that it is positioned or aligned with respect to the "bow-tie" section of pattern 42. The two different conductive materials may be, for example, epoxy based silver for one pattern and epoxy based nickel or carbon for the other conductive pattern. A silk screen patterned to correspond to the conductive pattern 44 may be used for this purpose;

(e) depositing (printing or coating) a scale 48 for each of the patterns 42 and 44 on the opposite side of substrate 41 such that the center thereof is aligned with the "bow-tie" section of conductive patterns 42 and 44. Silk screens with appropriate cut out patterns for the scale segments may be used;

(f) depositing a layer or band 49 of a black backer or absorber material such as black latex or uv curing paint, of a desired length and width on the other or opposite side of substrate 41 so as to extend over and align with the central section of scale 48 and the "bow-tie" section of patterns 42 and 44. This may be done using a template cut out to correspond to the desired shape and dimensions or may be silk screen or off-set printed on the substrate material;

(g) depositing (printing or coating) on the substrate 41 and over backer layer 49, a layer or coating 50 of a microencapsulated liquid crystal material. This may be accomplished using a template cut out to the required or desired pattern or dimensions or may be silk screen or off set printed on the substrate; and (h) depositing (printing or coating) protective non-conductive films 45 and 51 over the areas of the conductive patterns 44 except at contact points 47 and over the liquid crystal layer 50, using materials such as uv curing paints. This provides environmental and insulative protection for the patterns 44. The protective layer may be omitted, if desired.

In fabricating the battery tester of FIG. 4, the above process may be modified such that the conductive patterns 42 and 44 are printed, painted or coated over a black absorber or backer layer located on the same side of substrate 41 as the patterns, but such that the terminal ends extend beyond the absorber or backer layer. In addition, the width of the absorber layer 49 may be increased from that shown in FIG. 5 such that an outer portion of conductive pattern 42 contacting the contact points 46 is exposed (not covered or backed by absorber 49) so as to expose less of the silver conductive material. However, it is preferred that the black band or absorber layer 49 be made narrow as shown in FIG. 5, to delineate a sharp vertical or horizontal line as the liquid crystal material changes color when it is heated by the conductive pattern as the current passes therethrough.

Although the preferred method of fabrication shows the foregoing sequence of steps, such sequence is neither crucial nor necessary for the operation or practice of the present invention. Alternatively, the liquid crystal, absorber, conductive patterns and the protective coating may all be located on the same side of the substrate. For instance, a layer of the liquid crystal material is initially deposited on the substrate, followed by a layer of the absorber. The conductive patterns are then deposited on top of the absorber, but with an insulative layer between the patterns and then coated with the insulating protective coating.

The operation of the battery tester such as the embodiment thereof illustrated in FIG. 4 is carried out by positioning contact points 47 on the terminals of a battery, in the same manner as illustrated in FIG. 3 for a 1.5 volt battery. For testing a 9 volt battery, the battery terminals would be placed in contact with contact points 46.

Figure 6:
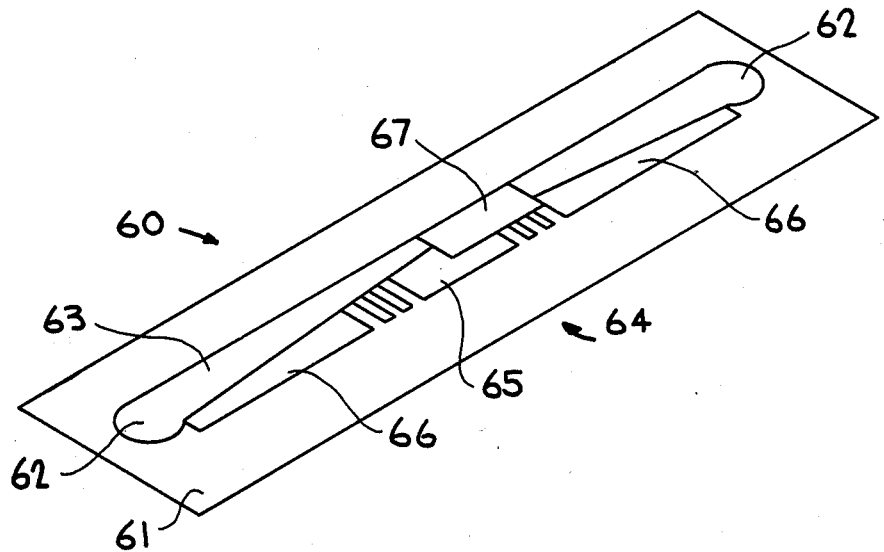
FIG. 6 is an embodiment of a tester made in accordance with the subject invention which additionally incorporates means for determining the amp-hours of a battery being tested.

Referring now to the embodiment illustrated in FIG. 6, which, for simplicity, illustrates only a 1.5 volt conductive pattern, but a 9 volt pattern may be added as shown in either FIG. 2 or FIG. 4, with the additional amp-hour indicator feature being included. The amp-hour indicator is composed of a quantity of polyacetylenic material positioned on top of a section of the liquid crystal material, which optically turns dark with time and temperature. This indicates amp-hrs or the number of hours and amperes discharged (for determining the remaining battery life). It can also be used for warranty purposes on small electricals, electrical appliances and the like.

Referring now to FIG. 6, the battery tester generally indicated at 60 comprises a substrate 61 on which is deposited a conductive pattern having contact points 62. The conductive pattern includes a "bow-tie" shaped section over which is deposited a quantity of liquid crystal material 63, with a scale or voltage indicator 64 positioned adjacent the liquid crystal material 63. The scale 64 may include a center segment 65 and a pair of outer segments 66 which function as described above with respect to segments 54 and 55 of the FIG. 4 embodiment. Also, while not shown, the embodiment of FIG. 6 may utilize a layer of absorber or backer material as described above. Positioned on one wedge or section of the "bow-tie", commencing at the center thereof, is a layer of polyacetylenic material 67, forming an amp-hour indicator. However, if desired, the material 67 may extend along the center segments or sections of both wedges of the "bow-tie". The polyacetylenic material may also be disposed as a detachable layer.

By way of example, the material 67 may be composed of acetylenic polymethane, polydiacetylene, or polydiacetylenic urethanes, and extends along a length of polydiacetylenes with the "bow-tie", for example, having the dimensions described in the embodiment represented by FIG. 1.

In operation, the embodiment of FIG. 6, with the contact points 62 in contact with the terminals of a 1.5 volt battery, such as that shown in FIG. 3, the liquid crystal material 63 changes color proportional to the condition of the battery, as described earlier. The polyacetylenic material turns dark as a function of time with the passage of current. The materials used for the various components 61, 62, 63 and 64 in FIG. 6 may be the same as those described for the embodiment of FIG. 4.

Figure 7:
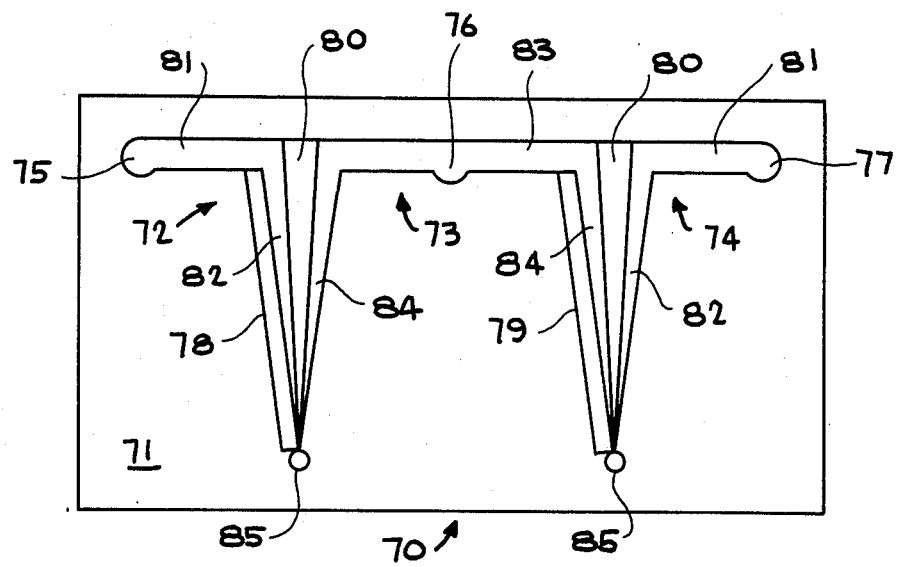
FIGS. 7 and 7A illustrate embodiments of a tester made in accordance with the invention which includes a plurality of voltage taps whereby batteries of different voltages can be tested with the same tester.
Figure 7A:
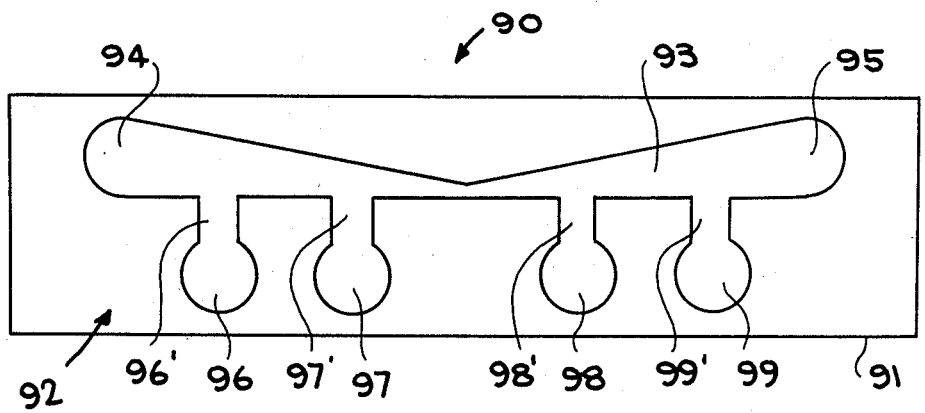

The embodiments illustrated in FIGS. 7 and 7A incorporate a plurality of voltage taps or battery contact points which enable the same tester to be used on batteries of different voltages, such as the 1.5 volt battery as described above, or 4.5, 6 and 9 volt batteries, for example. while not shown in the figure, it is within the scope of this invention to utilize a substrate configuration which has a folded or accordion (expandable or contractable) or hand-fan type construction for use with multiple batteries with the same or different voltages.

Referring first to FIG. 7, a tester using the plural contact point or tap arrangement is generally indicated at 70 and includes a substrate 71 on which is deposited a conductive pattern composed of segments or sections generally indicated at 72, 73, and 74 with respective contact points or voltage taps at 75, 76 and 77. A pair of layers of liquid crystal material 78 and 79 are deposited onto substrate 71 adjacent conductive pattern sections or segments 72 and 73. A backer or absorber layer 80 is deposited so as to be between substrate 71 and both of the conductive patterns and the liquid crystal material, and functions as described above. Conductive pattern segments 72 and 74 are in the general form of an upside-down L-configuration, while pattern segment 73 is in the general shape or form of an upside-down U configuration. The pattern segments 72 and 74 each basically consist of a base section 81 and an arm or leg section 82, while pattern segment 73 basically consists of a base section 83 and a pair of arm or leg sections 84. Note that the arm sections 82 and 84 form an angle with respect to the base section which is greater than 90°. Each of arm or leg sections 82 and 84 taper from their base section 81 and 83 to a point of interconnection at 85 so as to form a continuous conductive pattern from contact point or tap 77. The layer of liquid crystal material 78 is located adjacent arm or leg section 82 of conductive pattern segment 72, while liquid crystal material layer 79 is located adjacent arm or leg section 84 of conductive pattern segment 73. While not shown, a scale or voltage indicator as described earlier, may be located adjacent the liquid crystal material layers 78 and 79.

In the operation of the tester of FIG. 7, the terminals of a battery to be tested are placed in contact with two of the three contact points 75, 76 and 77, depending on the voltage of the battery being tested. As the current flows through the conductive pattern, it causes heating and change in color of the liquid crystal material proportional to the flow of current which is, in turn, proportional to the charge state or condition of the battery.

With the battery terminals being in contact with contact points 75 and 77, for example, and considering the battery to be a 6 volt type, the voltage may be easily read on the appropriately calibrated scale.

With the battery terminals being in contact with contact points 75 and 76, or with contact points 75 and 77, and considering the battery to be a 4.5 volt type, a voltage reading may be obtained from the appropriately calibrated scale.

Fabrication of the embodiment of FIG. 7 may be carried out in a manner as described earlier. The primary difference here is in the configuration of the conductive pattern and in the location of the liquid crystal material adjacent the conductive pattern rather than being deposited on top of the conductive pattern.

By way of example, the conductive pattern segments 72, 73 and 74 may have the following dimensions. Segments 72 and 74 have a base section 81 with a length of $4\frac{3}{4}''$, including contact points 75 and 76 and with a width of 0.200", with contact points having a radius of about 0.250'. The arm or leg sections 82 of segments 72 and 74 have a length of 1¾", and tapering from a thickness of 0.150" at the base 81 to 0.030" at interconnecting point 85. The angle of the arm or leg sections 82 with respect to the base section 81 is 0.88. Conductive pattern, the backer or absorber layer, and the liquid crystals may be composed of the same materials as described earlier in connection with the embodiments of FIGS. 2 and 4. Additionally, a protective film or coating may be applied over at least the conductive pattern except over the contact points, as previously described.

FIG. 7A illustrates another multiple voltage tap arrangement but differs from that illustrated in FIG. 7 in that the liquid crystal material is deposited on the "bow-tie" section of the conductive pattern, rather than adjacent the conductive pattern, and each additional voltage tap is connected to the "bow-tie" by a conductive path. An indicator scale is not shown but may be positioned as illustrated in FIG. 6, but designed to indicate the voltage when different voltage settings or taps or contact points are used.

As shown in FIG. 7A, the tester, generally indicated at 90, basically comprises a substrate 91, a conductive pattern generally indicated at 92 and a layer of liquid crystal material 93 located over the "bow-tie" section of the conductive pattern, as in the embodiment of FIG. 6. A layer of backer or absorber material, not shown, can be deposited beneath the liquid crystal material as previously described. The "bow-tie" section of the conductive pattern 92 terminates at the other ends thereof in contact points 94 and 95. A plurality of contact points 96, 97 98 and 99 are spaced along the length of the pattern 92 and are connected to the "bow-tie" by respective conductive paths 96', 97',98' and 99'. Each of the contact points are designed and positioned such that when a battery is connected between a set of contact points, it is tested under a resistive load similar to that in its normal operational uses. As previously described, a protective layer or film may be applied over the conductive pattern, except over the contact points, and over the liquid crystal material, if desired.

By way of example, to test a 1.5-volt battery, contact points 97 and 98 would be used. For a 4.5-volt battery, contact points 96 and 99 would be used. For a 6-volt battery, contact points 95 and 94 would be employed.

The embodiment of FIG. 7A may be fabricated using the techniques and materials previously described.

While the embodiments of FIG. 4, 6 and 7A use conductive patterns, including a "bow-tie" shaped section, other conductive patterns or shapes may be used provided that the correct resistance ratio is maintained along the length of the pattern. Although two conductive patterns are deposited on the same substrate as illustrated in FIG. 4 for ease and convenience of use, the subject tester is not limited to such a configuration. For instance, where only a tester for the 9 volt type battery with two adjacent terminals is desired, the substrate on which the conductive pattern is deposited need not be flexible and/or transparent so long as transparent windows or window sections are provided in the substrate to correspond with the contact terminal end sections of the conductive material or pattern of the tester so that the user can easily match the tester terminals with the battery terminals. Only one conductive pattern, one for the 1.5 volt battery type and one for the 9 volt battery type, may be deposited each on a separate piece of substrate. Two conductive patterns for the same general type of batteries i.e., with terminals located at opposite ends thereof, but with different voltage capacities, may also be deposited on the same substrate piece, for example, a 1.5 volt and a 4.5 volt battery each with terminals located at opposite ends thereof as illustrated in FIG. 6. Two dissimilar conductive patterns or two dissimilar materials with different resistivities, such as silver and nickel, or silver and carbon or carbon and nickel, may also be utilized for different resistive loads and different voltages other than 1.5 and 9.

It has thus been shown that the present invention provides a device of simple construction which yet provides an effective, inexpensive, completely portable and simple means for testing the condition or voltage output of small portable batteries such as for example dry cell batteries. The invention, thus, fills the need which has existed in the art of battery testing devices.

The foregoing description of various embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A battery tester which utilizes liquid crystal material that changes color proportional to the current produced by a battery being tested, said tester comprising:
   a substrate constructed of flexible material;
   at least one pattern of electrically conductive material having terminal end sections located on said substrate; and
   at least one layer of a cholesteric liquid crystal material located on said substrate and in alignment with and extending along a portion of said conductive material pattern;
   said substrate being constructed of material of sufficient flexibility to enable said terminal end sections of said electrically conductive material to be placed in contact with the terminals of an associated battery; scale means having calibration markings thereon for indicating the strength of an associated battery; and
   whereby contact of said terminal end sections with terminals of an associated battery to be tested causes a current to flow through said condutive material which causes portions of said conductive material to heat, the heat being transferred to said liquid crystal material causing said liquid crystal material to change color proportional to the current flowing through said conductive material.

2. The battery tester of claim 1, further including a layer of absorber material located on a portion of said substrate and underneath said liquid crystal material.

3. The battery tester of claim 1, further including a scale located on said substrate and extending substantially parallel to at least portions of said pattern.

4. The battery tester of claim 1, further including a pair of different patterns of electrically conductive material superimposed on one another and separated from one another by a layer of insulative material.

5. The battery tester of claim 4, wherein said patterns of electrically conductive material are located on one side of said substrate, and wherein said liquid crystal material is located on an opposite side of said substrate.

6. The battery tester of claim 5, wherein said substrate is constructed of transparent material.

7. The battery tester of claim 5, additionally including a layer of absorber material located between said substrate and said liquid crystal material.

8. The battery tester of claim 5, additionally including a scale located on said substrate adjacent to and extending along at least a portion of said layer of liquid crystal material.

9. The battery tester of claim 5, additionally including a protective coating over at least said patterns of conductive material except at the location of said terminal end sections of said patterns.

10. The battery tester of claim 1, additionally including means for determining amp-hours of an associated battery to be tested, said means being located along a section of said liquid crystal material.

11. The battery tester of claim 10, wherein said means includes a quantity of polyacetylenic material.

12. The battery tester of claim 1, wherein said pattern of electrically conductive material includes at least one contact point located intermediate said terminal end sections thereof.

13. The battery tester of claim 12, wherein said pattern of conductive material includes at least a pair of generally L-shaped sections at least one generally U-shaped section, each of said L-shaped sections having a base portion and an arm portion, said U-shaped section having a base portion and a pair of arm portions, said U-shaped section being positioned intermediate said L-shaped sections and having each of said arm portions connected at an outer end thereof to an outer end of an arm portion of said L-shaped section, said terminal end sections of said pattern of conductive material being located in said base portions of said L-shaped section, said contact point being located in said base portion of said U-shaped section.

14. The battery tester of claim 13, wherein said layer of liquid crystal material is located along one of said arm portions of said pattern of conductive material.

15. The battery tester of claim 13, wherein a layer of liquid crystal material is located adjacent an arm portion of one of said L-shaped sections and another layer of liquid crystal material is located adjacent an arm portion of said U-shaped section.

16. The battery tester of claim 13, wherein said arm portions of said L-shaped sections and said U-shaped sections are tapered in a direction outwardly from said base portions thereof.

17. The battery tester of claim 12, wherein said pattern of electrically conductive material includes a plurality of contact points located in spaced relation with one another and intermediate said terminal end sections of said conductive material.

18. The battery tester of claim 12, wherein said pattern of electrically conductive material includes a "bow-tie" configured section, and wherein said plurality of contact points are located along said "bow-tie" configured section and connected thereto by conductive paths.

* * * * *